United States Patent [19]

Uratani

[11] Patent Number: 4,783,692
[45] Date of Patent: Nov. 8, 1988

[54] CMOS GATE ARRAY

[75] Inventor: Munehiro Uratani, Kashihara, Japan

[73] Assignee: Sharp Kabushiki Kaisha, Osaka, Japan

[21] Appl. No.: 859,208

[22] Filed: Apr. 28, 1986

Related U.S. Application Data

[63] Continuation of Ser. No. 648,283, Sep. 7, 1984, abandoned.

[30] Foreign Application Priority Data

Sep. 20, 1983 [JP] Japan ................. 58-174984

[51] Int. Cl.⁴ .......................................... H01L 27/10
[52] U.S. Cl. ........................................ 357/45; 357/42; 357/40
[58] Field of Search .................. 357/42, 45, 40

[56] References Cited

U.S. PATENT DOCUMENTS 3,652,906 3/1972 Christensen ............... 357/23.14
4,412,237 10/1983 Matsumura et al. ............ 357/41

Primary Examiner—Andrew J. James
Assistant Examiner—Mark Prenty
Attorney, Agent, or Firm—Birch, Stewart, Kolasch & Birch

[57] ABSTRACT

A semiconductor device in a CMOS gate array in which a basic cell has inputs by the number of n, wherein the basic cell comprises 2n PMOS transistors and 2r NMOS transistors is disclosed. The basic cell comprises, in a same basic cell, MOS transistors having at least two gate electrodes connected in common and MOS transistors operated on one gate electrode, and a logic circuit is formed by transistors of different gate width.

6 Claims, 4 Drawing Sheets

CMOS GATE ARRAY

This application is a continuation of application Ser. No. 648,283, filed on Sept. 7, 1984, and now abandoned.

BACKGROUND OF THE INVENTION

This invention concerns a CMOS gate array and, more specifically, it relates to a basic cell structure constituting a circuit.

The CMOS gate arrays have advantages in that their power consumption is extremely low and the degree of integration can be increased but, there is a disadvantage in that the operation speed is lower as compared with TTL or ECL gate array.

FIG. 1 shows the basic structure of a gate array, in which the chip plane can be divided into a wiring region 1 and basic cell regions 2. In the wiring region 1, first layer metal wirings 3, are usually formed in the horizontal direction (shown by the solid line in the drawing), the second layer metal wirings, 4, are formed in the vertical direction (shown the dotted chain in the drawing), and electrical contacts are established at the crossing points of the wirings by way of through holes. The second layer metal wirings 4 are arranged such that they can be laid along the vertical direction on the basic cell regions 2, and can be connected with other wiring in region 1.

Each of the basic cell regions 2 comprises basic cells 20, each having the identical substrate structure which are disposed side by side along the horizontal direction in the drawing. In the case of a 2-input gate basic cell, ech cell requires five second layer metal wirings including two input terminals 41, 42, one output terminal 43 and two wires situated on the basic cell region. In the ordinary design of the gate array the configuration of the basic cell is restricted by the second layer metal wirings as described later.

FIG. 2 shows a basic cell structure where the basic cell 20 shown in FIG. 1 is constituted as a 2-input gate array using CMOSs. In the figure, a region, 5, for a P channel MOS transistor defined with the length L1 and the width Wp and a region 6 for a N channel MOS transistor defind with the legth L1 and the width Wn are disposed in pair. Those regions 51, 52, 53 and 61, 62, 63, divided by the solid lines in the regions 5 and 6, represent respectively diffusion regions for forming each of the transistors. Polysilicon gates 71, 72, 81, 82 are disposed by way of a gate insulating film on a substrate between each of the adjacent diffusion regions 51 and 52, 52 and 53, 61 and 62, and 62 and 63. In the figure, the mark X indicated at one end for each of the polysilicon gate electrodes represents a contact for the connection between each of the polysilicon gates 71, 72, 81 and 82 and the first layer metal wirings. Furthermore, contacts 91-96 and 101-106 are disposed to the respective regions diffusion regions 51, 52, 53, 61, 62 and 63 as required in order to make electrical connection with the first layer metal wirings. In the drawing, VCC and GND lines shown by the broken line represent the first metal wirings for the power source line. Further, the marks "o", 111-116, shown in the wiring region represent through holes between the first layer metal wiring 3 and the second layer metal wiring 4. The second layer metal wirings are formed in a direction parallel to polysilicon gates 71, 72, 81, 82.

The conventional CMOS gate array comprising the cell structure as described above has a restriction in that the lateral size Li of the cell is generally determined by the pitch x, the number of the second layer metal wirings where the length L1 is dependent upon the number of second layer metal wirings in the gate array. In the case where the cell size is determined depending on the second layer metal wirings as described above, there are problems in that excess space is left in view of the design rule with respect to the diffusion region 5 constituting the transistor in the basic cell regions 2 or near the contact portion between the polysilicon gates and the first layer metal wirings in the wiring region 1, hindering effective utilization of the substrate. Also, the inherent defect of the CMOS, that its operational speed is slow, cannot be prevented in the circuit constituted with the conventional cell structure.

SUMMARY OF THE INVENTION

This invention relates to the foregoing problems in the conventional CMOS gate array and it is an object thereof to provide a CMOS gate array semiconductor device having a cell structure that is suitable to increasing the operation speed while occupying the same area as the conventional cell.

Other objects and further scope of applicability of this invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

The CMOS gate array semiconductor device of one embodiment according to this invention comprises in a CMOS gate array having a basic cell equipped with n inputs, and 2n PMOS transistors and 2n NMOS transistors.

The basic cell described above comprises MOS transistors having at least two gate electrodes connected in common and MOS transistors operated on one gate electrode in the same basic cell, and a logic circuit is constituted with transistors of different gate width.

BRIEF DESCRIPTION OF THE DRAWINGS

This invention will be better understood from the detailed description given below and the accompanying drawings which are given by way of illustration only, and thus are not limitative of this invention and wherein.

DETAILED DESCRIPTION OF THE INVENTION

This invention will now be described more specifically by reference to an embodiment of a 2-input gate basic cell.

Figure 1:
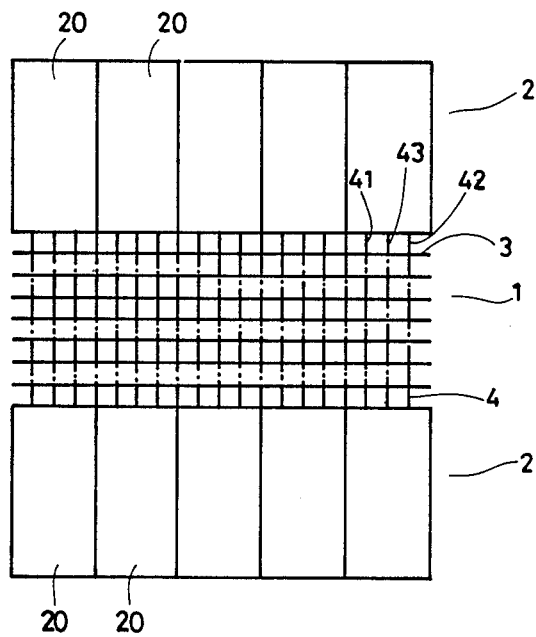
FIG. 1 is a fundamental structural view for a gate array.
Figure 2:
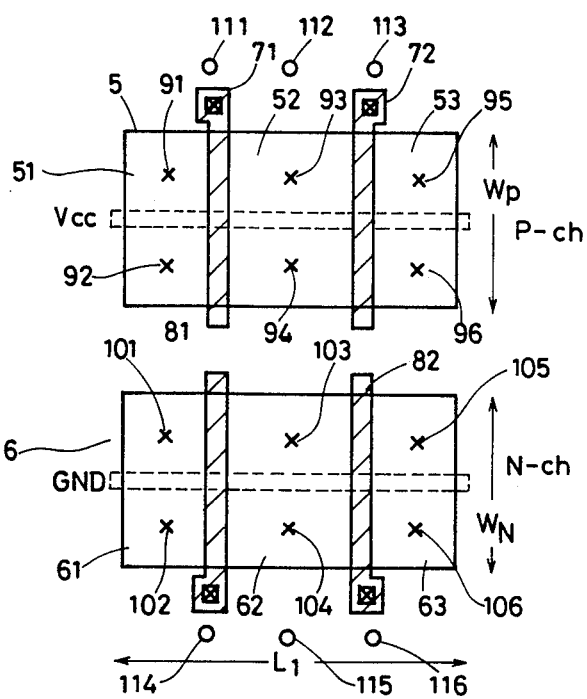
FIG. 2 is a plan view for the substrate showing a conventional 2-input gate basic cell.
Figures 3, 4:
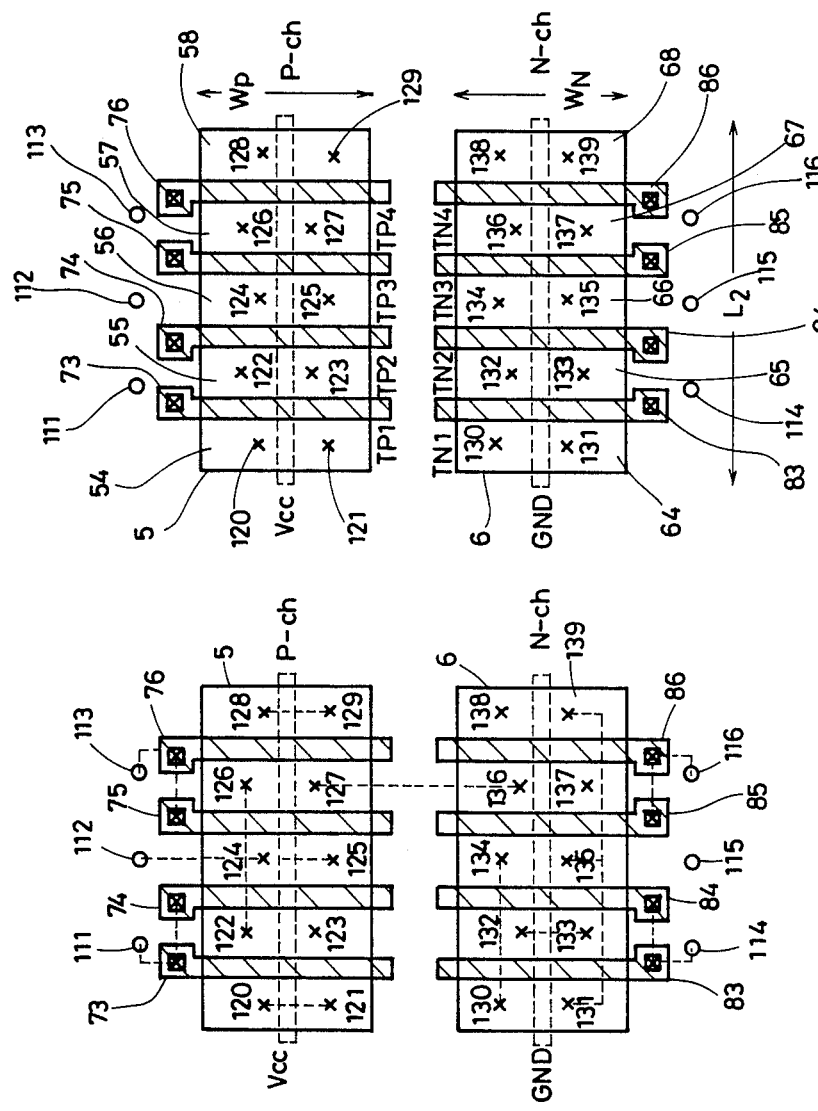
FIG. 3 is a plan view for the substrate of one embodiment according to this invention.
FIG. 4 is a plan view for the substrate in which the above embodiment is applied to a 2-input NAND circuit.

In FIG. 3, diffusion regions 54–58 and 64–68 are formed, constituting P channel and N channel MOS transistors. Polysilicon gates 73–76 and 83–86 are formed for use as gate electrodes on the surface of the substrate. The basic cells of this embodiment have the area length L2×width Wp and the length L2×width Wn respectively comprising twice the number of both PMOS and NMOS transistors with respect to the 2-input gate of the conventional structure of FIG. 2. Specifically, there is a utilizable space as described above for the diffusion regions and the polysilicon contact portions in the basic cells of the length L2, which is substantially determined by the pitch, x, the number of the second layer metal wirings, so that four polysilicon gates 73–76 and 83–86 are formed to 2-inputs. The result is that PMOS transistors TP1, TP2, TP3, TP4 and NMOS transistors TN1, TN2, TN3, TN4 are formed between the diffusion regions in the substrate. Contacts for electrical connection with the first layer metal wirings are disposed to each of the diffusion regions 54–58 and 64–68, as well as the polysilicon gates 73–76 and 83–86 in the same manner as in the conventional device. In addition, contacts 111–116 for the two input terminals and one output terminal required for constituting the 2-input gate are disposed in the wiring region, with respect to the second layer metal wirings.

Although the pattern in the basic cell of the foregoing structure is complicated, the function of the conventional basic cell can be duplicated by connecting the gates between TN1 an TN2, TN3 and TN4, TP1 and TP2, and TP3 and TP4 respectively.

FIG. 4 shows a 2-input NAND circuit using the basic cell shown in the embodiment described above, in which each of the contact portions 120–139 in the diffusion regions are adequately connected by means of the first layer metal wirings as shown by the broken line to constitute a NAND circuit composed of PMOS and NMOS transistors. Particularly, connections are made for the polysilicon between 73 and 74, 75 and 76, 83 and 84, and 85 and 86 which are connected respectively by means of the first layer metal wirings and they are further connected respectively to input terminals 111, 113, 114 and 116. By connecting the polysilicon gates to each other in this way, the gate width for each of the transistors is doubled thereby obtaining a NAND circuit with a faster operational speed.

The delay time in the gate array is generally dependent on the stray capacitance comprised of gate capacitance and wiring capacitance. Accordingly, by designing the gate width of the transistor in the foregoing embodiments to be twice as large as that of the conventional device the delay time due to the wiring capacitance can be reduced, increasing the operation speed.

In a 2-input NAND circuit shown in FIG. 4, the lateral size L2 of the basic cell can be made identical with the lateral size L1 of the conventional cell.

Futher, remarkable increase in both the operation speed and the degree of integration can be obtained in the basic cell of the foregoing embodiment, particularly, in the case of a macrocell logic circuit comprising a plurality of basic cells and fixed wirings between the cells for connecting them. This will be explained referring to FIG. 5 and FIG. 6.

Figure 5:
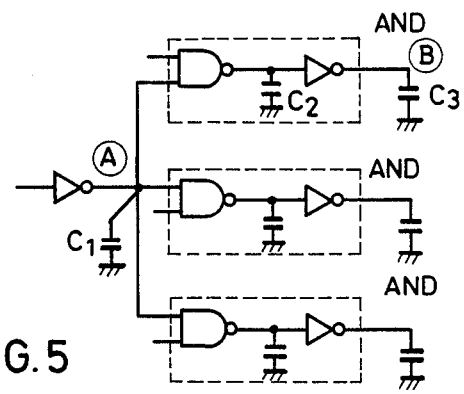
FIG. 5 is a circuit diagram using a microcell for evaluating the performance of this invention.
Figure 6:
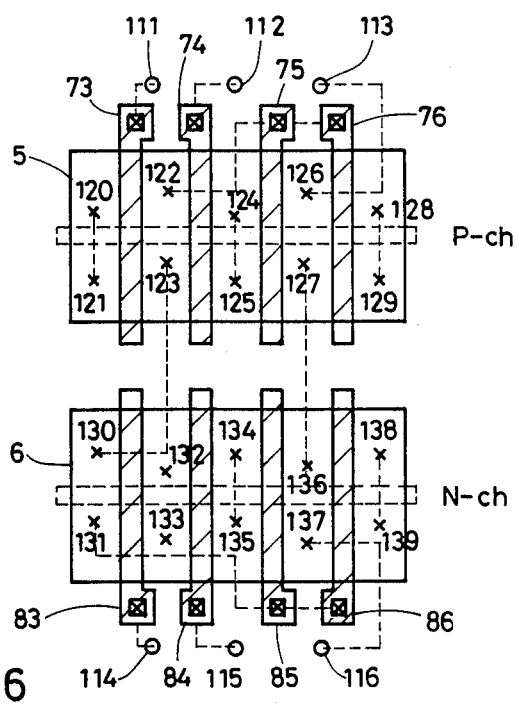
FIG. 6 is a plan view for the substrate of an AND circuit microcell according to one embodiment of this invention.

In the case where the AND circuit comprising a NAND gate and an inverter shown in FIG. 5 is constituted by using the basic cell of the conventional structure, it requires three PMOS transistors (gate width=Wp) and three NMOS transistors (gate width=Wn) and, accordingly, the circuit has to be constituted with two basic cells.

While on the other hand, in the AND circuit constituted with the basic cell as shown in the present embodiment, the contacts 120–139 in each of the diffusion regions constituting PMOS and NMOS transistors are connected with each other by the first layer metal wirings shown by the broken lines so as to constitute the AND circuit and, further, they are also connected with the polysilicon gates 73–76 and 83–86, as well as contacts 111–116 for the second layer metal wirings as indicated by the broken lines. As apparent from the drawing, the basic cells in the present embodiment can be obtained by connecting two PMOS transistors with gate width=Wp, one PMOS transistor with gate width=2Wp, two NMOS transistors with gate width=Wn and one NMOS transistor with gate width=2Wn by way of the first layer metal wirings thereby constitute the AND circuit shown in FIG. 5. Consequently, for attaining the circuit shown in FIG. 5 as a macrocell system by the basic cells and fixed wirings connecting between the cells, while seven basic cells have been required in the conventional structure, it needs only four basic cells in the present embodiment to thereby obtain a circuit with a remarkably improved degree of integration.

The present embodiment is advantageous also in view of the operational speed referring to FIG. 5.

Assuming the wiring capacitance as CL, gate capacitance (PMOS transistor with gate width Wp+NMOS transistor with gate width Wn) as CG, the amplification factor of the driving side transistor as β (provided what the amplification factor of the PMOS transistor with gate width Wp is equal to the amplification factor of the NMOS transistor with gate width Wn) in the AND circuit shown in FIG. 5, the delay time tpd between the point A and the point B is given by the following equations:

In the conventional cell:

$$tpd1 \; \alpha \; \frac{C_1}{\beta} + \frac{C_2}{\beta} + \frac{C_3}{\beta} = \frac{3C_G + C_L}{\beta} + \frac{C_G}{\beta} + \quad (1)$$

$$\frac{8C_G + C_L}{\beta} = \frac{7C_G + 2C_L}{\beta}$$

In the basic cell according to the present embodiment:

$$tpd2 \; \alpha \; \frac{C_1}{2\beta} + \frac{C_2}{\beta} + \frac{C_3}{2\beta} = \frac{3C_G + C_L}{2\beta} + \frac{2C_G}{\beta} + \quad (2)$$

$$\frac{8C_G + C_L}{2\beta} = \frac{5C_G + 2C_L}{\beta}$$

where it is assuming that C3 has the same load capacitance as C1.

Figure 7:
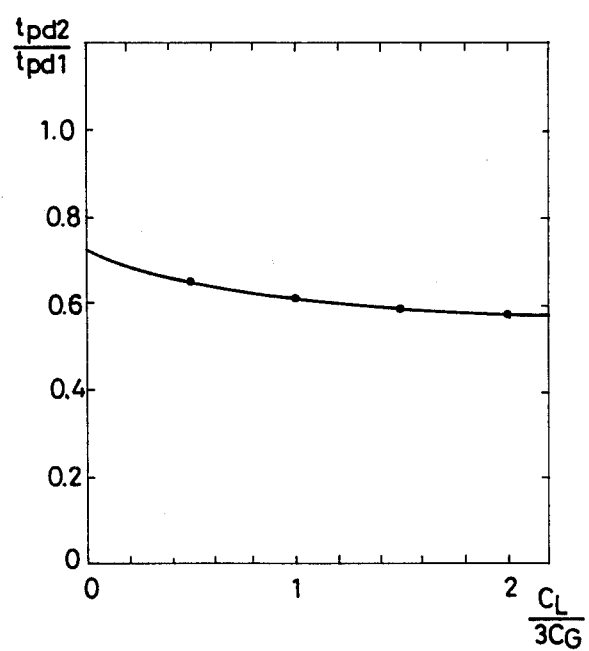
FIG. 7 is a chart for comparing the operation speeds between the one embodiment of this invention and a conventional CMOS gate array.

FIG. 7 is a graph obtained by determining the ratio of the delay times between the present embodiment and the conventional cell based on the equations (1) and (2), which shows that tpd2/tpd1=0.6–0.7. This ratio arises irrespective of the ratio between the wiring capacitance and the gate capacitance. In this way, by equalizing the delay time for each of the gates using transistors of different gate width in the microcell, the operation speed can be increased.

As described above, according to this invention, increase in the degree of integration and the operation speed of the CMOS gate array can be obtained, whereby the range of the application use for the CMOS gate array can be enlarged.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A basic cell forming part of a gate array, said gate array having a plurality of cells from which a desired circuit may be constructed, and having only a pair of input lines and a single output line associated with each said cell, the number of transistors in said cell being limited by the number of cell input and output lines, said basic cell comprising:

a P-type semiconductor region and an N-type semiconductor region;

four gate electrodes extending across each said semiconductor region, said gate electrodes of said cell being commonly connected into gate electrode pairs to form single transistors to thereby increase the effective gate width of each said transistor while better utilizing the area of said cell.

2. The basic cell of claim 1 wherein each adjacent pair of electrodes is commonly connected, each common connected adjacent pair of electrodes forming a single transistor input gate, said basic cell comprising two P-type transistors that are formed in said P-region, and two N-type transistors that are formed in said N-region.

3. The basic cell of claim 1 wherein said cell is of the CMOS type.

4. The basic cell of claim 2 wherein said gate electrodes are formed of polysilicon.

5. The basic cell of claim 4 wherein each said transistor diffusion region has a metal wiring connected thereto, the pattern of said metal wiring connecting said transistors and defining the desired circuit within said basic cell.

6. The basic cell of claim 2 wherein said cell is of the CMOS type.

* * * * *